United States Patent
Li et al.

(10) Patent No.: US 8,735,968 B2
(45) Date of Patent: May 27, 2014

(54) INTEGRATED MOSFET DEVICES WITH SCHOTTKY DIODES AND ASSOCIATED METHODS OF MANUFACTURING

(75) Inventors: Tiesheng Li, San Jose, CA (US); Lei Zhang, Chengdu (CN)

(73) Assignee: Monolithic Power Systems, Inc., San Jose, CA (US)

( * ) Notice: Subject to any disclaimer, the term of this patent is extended or adjusted under 35 U.S.C. 154(b) by 314 days.

(21) Appl. No.: 12/980,143

(22) Filed: Dec. 28, 2010

(65) Prior Publication Data
US 2012/0161225 A1 Jun. 28, 2012

(51) Int. Cl.
*H01L 27/105* (2006.01)
*H01L 21/8234* (2006.01)

(52) U.S. Cl.
USPC .............. 257/328; 257/331; 257/355

(58) Field of Classification Search
USPC ................... 257/328–346, E29.183
See application file for complete search history.

(56) References Cited

U.S. PATENT DOCUMENTS

| | | | |
|---|---|---|---|
| 6,707,128 B2 * | 3/2004 | Moriguchi et al. | 257/484 |
| 8,241,978 B2 * | 8/2012 | Lin et al. | 257/334 |
| 8,274,086 B2 * | 9/2012 | Malhan et al. | 257/76 |
| 2008/0265312 A1 * | 10/2008 | Bhalla et al. | 257/328 |
| 2010/0148718 A1 * | 6/2010 | Kitabatake et al. | 257/280 |

* cited by examiner

*Primary Examiner* — Cuong Q Nguyen
(74) *Attorney, Agent, or Firm* — Perkins Coie LLP

(57) ABSTRACT

The present technology discloses a semiconductor die integrating a MOSFET device and a Schottky diode. The semiconductor die comprises a MOSFET area comprising the active region of MOSFET, a Schottky diode area comprising the active region of Schottky diode, and a termination area comprising termination structures. Wherein the Schottky diode area is placed between the MOSFET area and the termination area such that the Schottky diode area surrounds the MOSFET area.

11 Claims, 7 Drawing Sheets

INTEGRATED MOSFET DEVICES WITH SCHOTTKY DIODES AND ASSOCIATED METHODS OF MANUFACTURING

TECHNICAL FIELD

The present technology generally relates to semiconductor devices; and more particularly, relates to integrated metal oxide field-effect transistor ("MOSFET") devices with Schottky diodes and associated methods of manufacturing.

BACKGROUND

MOSFET devices are widely used in DC/DC power systems as switches. In a buck circuit, as shown in FIG. 1, the high side MOSFET M1 and the low side MOSFET M2 are both OFF during a switching transition in order to prevent MOSFET damage under high current. So a fixed dead time is adopted in the circuit during which both of the high side MOSFET and the low side MOSFET are OFF. During this dead time, output current required by load RL flows through the body diode D0 of the low side MOSFET M2. However, the power consumption of the body diode D0 during forward conduction is high since the forward built-in voltage of the P-N junction of the diode D0 is around 0.7V. Also, the P-N junction of the diode D0 typically has bad reverse recovery characteristics since both holes and electrons participate in forward conduction.

Schottky diodes have much lower forward built-in voltage than that of the P-N junction diodes due to the metal-semiconductor contact, commonly referred to as the Schottky contact. So Schottky diodes consume less power than P-N junction diodes during forward conduction. Also, Schottky diodes have better reverse recovery characteristics than P-N junction diodes by having faster reverse recovery speed. Thus, it is desired for techniques to integrate a MOSFET and a Schottky diode in a monolithic semiconductor die.

DETAILED DESCRIPTION

The following description provides a description for certain embodiments of the technology. One skilled in the art will understand that the technology may be practiced without some or all of the features described herein. In some instances, well known structures and functions are not shown or described in detail to avoid unnecessarily obscuring the description of the embodiments of the technology. In other instances, similar structures and functions that have been described in detail for other embodiments are omitted to simplify and make clear understanding of the various embodiments.

According to one embodiment of the present technology, a MOSFET and a Schottky diode are integrated in one semiconductor die. The semiconductor die comprises a MOSFET area comprising an active region of the MOSFET, a Schottky diode area comprising an active region of the Schottky diode, and a termination area comprising termination structures. The Schottky diode area is placed between the MOSFET area and the termination area such that the Schottky diode area surrounds the MOSFET area.

In another embodiment, a semiconductor device comprises an N+ substrate at the bottom side and an N− epitaxial layer above the substrate. A P body region and an N+ source region of the MOSFET are in an N− epitaxial layer. P-type rings are in the epitaxial layer, and Schottky contacts are between the adjacent P-type rings. A source metal is placed over the MOSFET and the Schottky contacts. The P-type rings surround the MOSFET.

Figure 1:
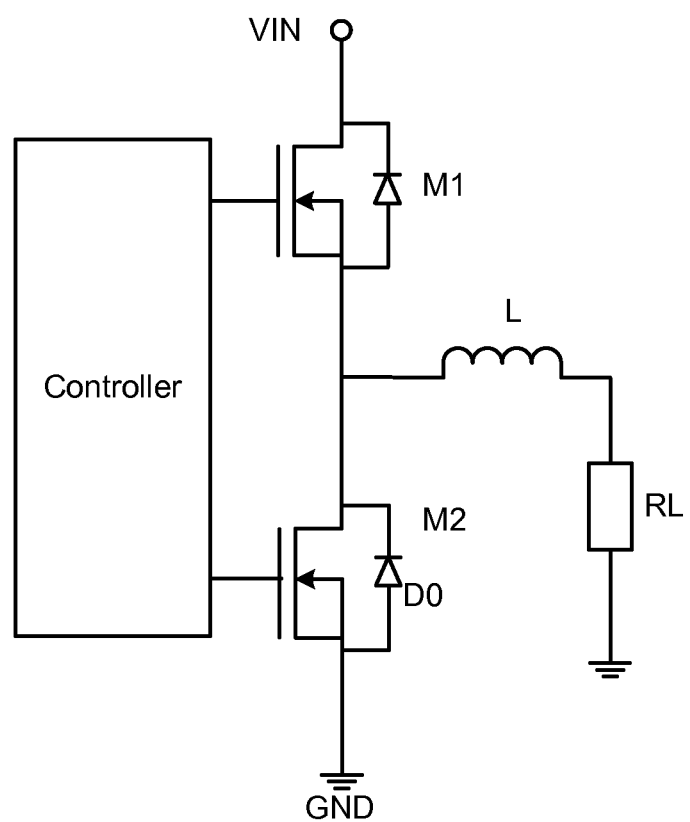
FIG. 1 shows a buck circuit in accordance with the prior art.
Figure 2A:
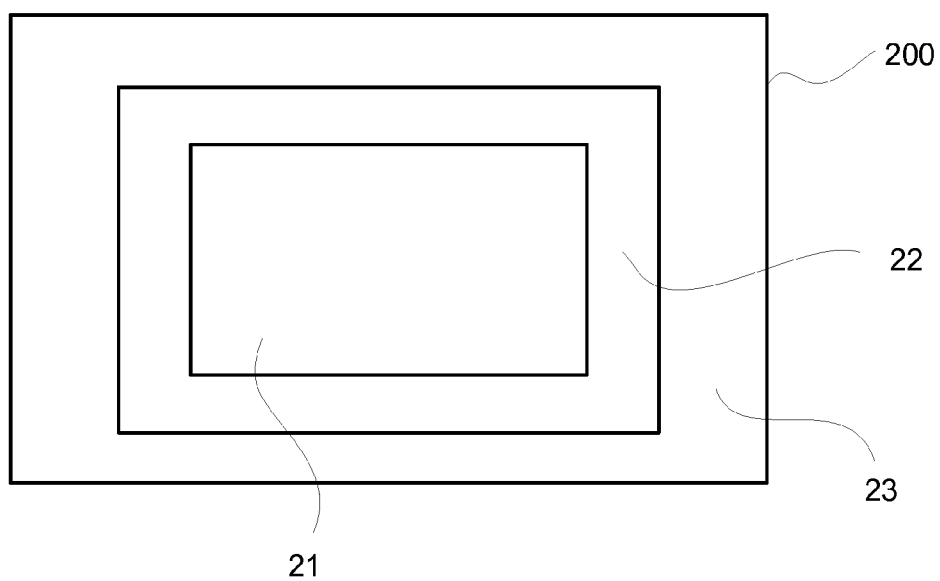
FIG. 2A illustrates a semiconductor die integrating a MOSFET and a Schottky diode according to embodiments of the present technology.

FIG. 2A is a top plane view showing an illustrative layout of a monolithic semiconductor die 200 integrating a MOSFET and a Schottky diode according to embodiments of the present technology. As shown in FIG. 2A, the semiconductor die 200 comprises a MOSFET area 21, a Schottky diode area 22 and a termination area 23. The MOSFET area 21 includes the active region of the MOSFET. The MOSFET area 21 is positioned at the inner region of the semiconductor die 200, or the inner region of one area which comprises part of the semiconductor die 200. The Schottky diode area 22 has the Schottky diode fabricated therein. The Schottky diode area 22 is placed outside and around the MOSFET area 21, but inside the termination area 23. In some embodiments, the termination area 23 comprises termination structures. In other embodiments, the termination area 23 further comprises a gate plate.

Figure 2B:
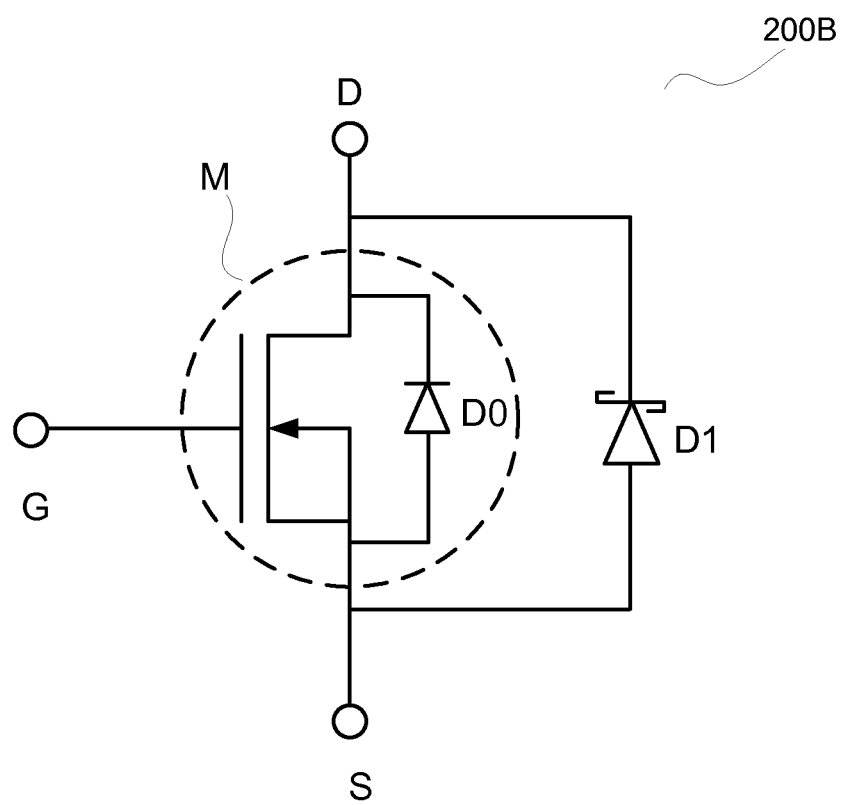
FIG. 2B shows a circuit fabricated on the semiconductor die in FIG. 2A.

FIG. 2B shows a circuit diagram of an integrated MOSFET and Schottky diode circuit 200B that can be fabricated on a semiconductor die 200 (FIG. 2A) according to embodiments of the technology. The circuit 200B comprises a MOSFET M and a Schottky diode D1 fabricated on a single semiconductor substrate in which the Schottky diode D1 is connected in parallel with the body diode D0 of the MOSFET M.

In certain embodiments, the MOSFET M can be fabricated in the MOSFET area 21 (FIG. 2A), and the Schottky diode D1 can be fabricated in the Schottky diode area 22 (FIG. 2B) of the semiconductor die 200. The MOSFET M has electrodes of source S, gate G and drain D. The anode of the Schottky diode D1 is connected to the source S of the MOSFET M, and the cathode of the Schottky diode D1 is connected to the drain D of the MOSFET M. In some embodiments, the circuit 200B functions as the low side switch of a buck circuit. In such a configuration, when the MOSFET M is forward biased, i.e., the source voltage VS is greater than the drain voltage VD, during dead time, the forward current flows through the Schottky diode D1 because it has lower conduction resistance than the body diode D0 of MOSFET M. When the current direction changes, the reverse recovery time for Schottky diode D1 is shorter than the body diode D0 of MOSFET M, and thus the frequency characteristic may be improved, and the power consumption induced by the parasitic capacitance of the body diode D0 can be reduced.

With the configuration of the Schottky diode D1 surrounding the MOSFET area 21, the size utilization rate of the semiconductor die 200 is high. Also, the forward current through the Schottky diode D1 can disperse around the semiconductor die 200 instead of being concentrated in a small area, thus resulting in good thermal characteristics.

Figure 3:
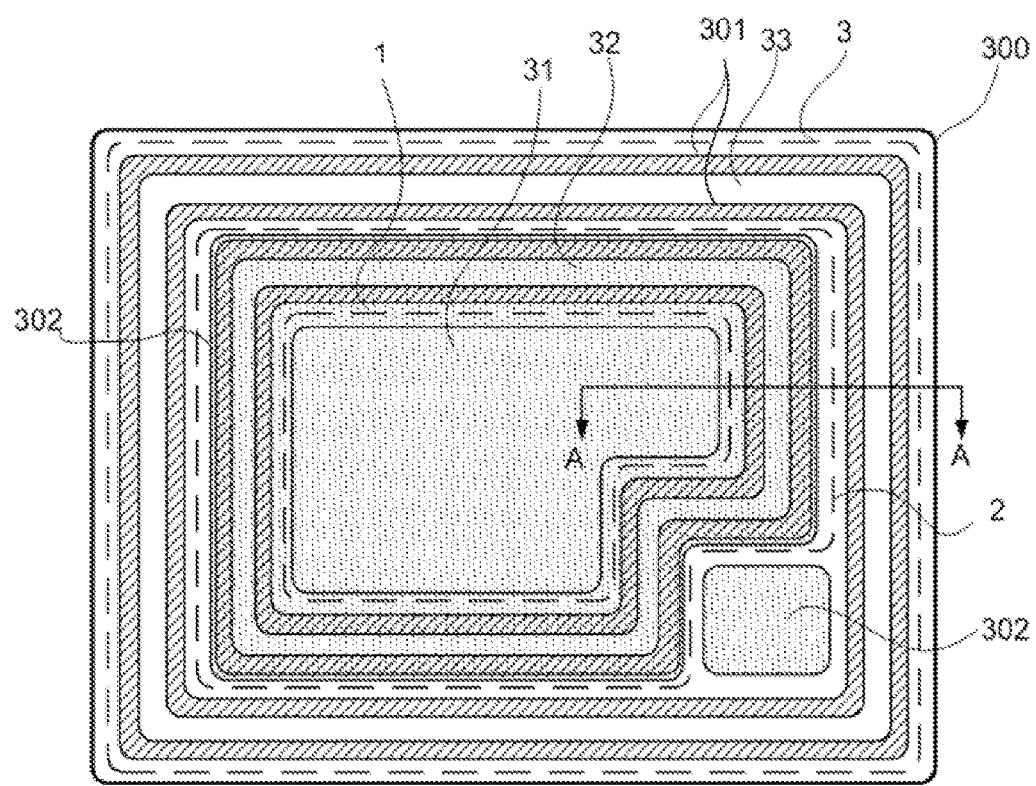
FIG. 3 shows a layout diagram of a semiconductor die integrating a MOSFET and a Schottky diode according to embodiments of the present technology.
Figure 4:
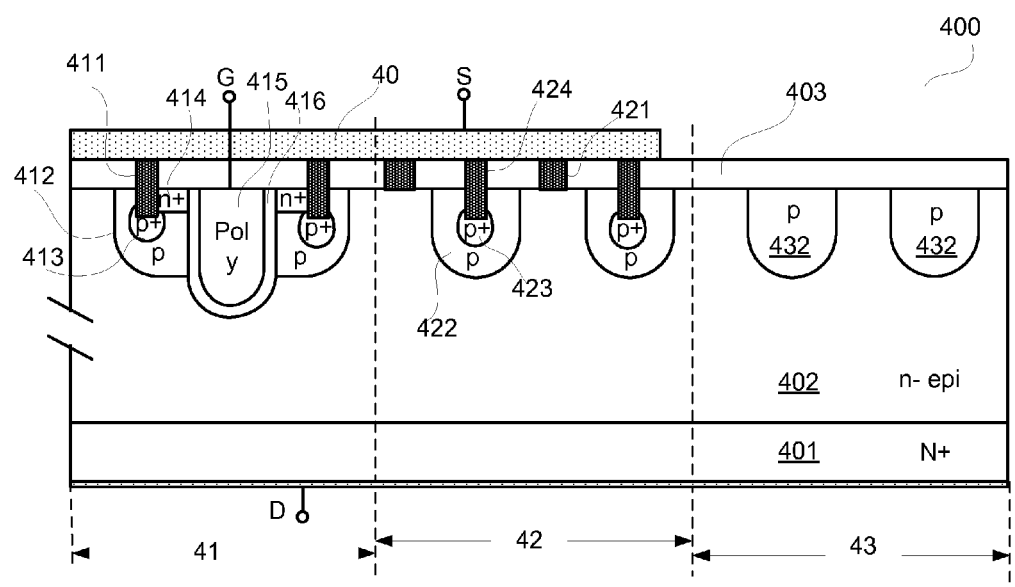
FIG. 4 shows a sectional diagram of the semiconductor die in FIG. 3.
Figure 5:
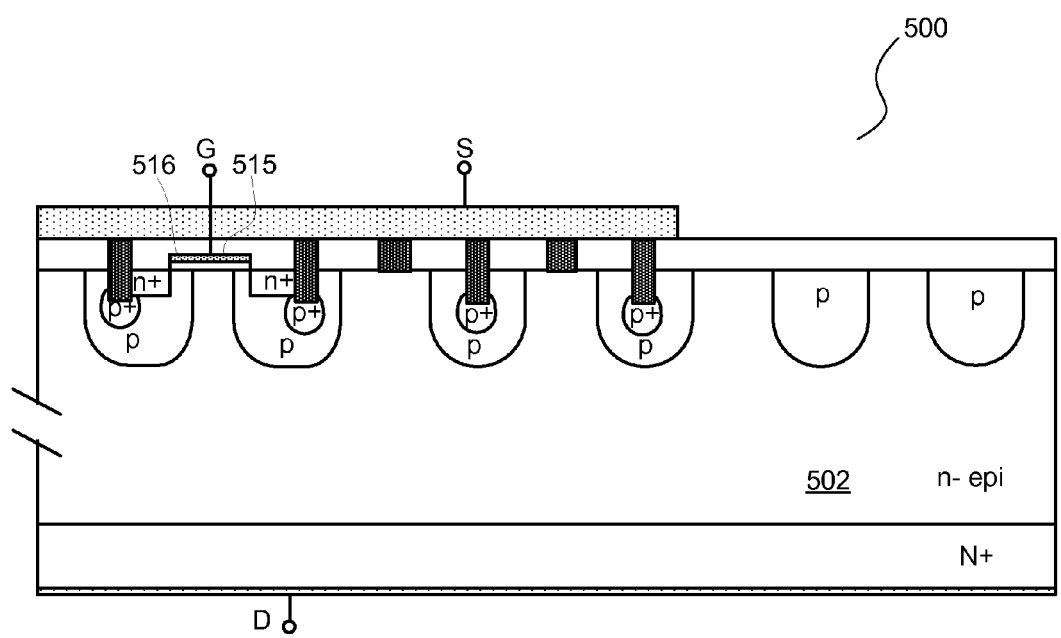
FIG. 5 shows another sectional diagram of the semiconductor die in FIG. 3.

FIG. 3 shows a layout scheme of a semiconductor die 300 integrating a MOSFET and a Schottky diode according to embodiments of the present technology. And FIG. 4 shows a sectional diagram 400 of the semiconductor die 300 integrating a trench gate MOSFET and a Schottky diode according to embodiments of the present technology. The sectional diagram 400 is sliced along the A-A line, perpendicular to the plane of FIG. 3. FIG. 5 shows another sectional diagram 500 of the semiconductor die 300 integrating a conventional MOSFET and Schottky diode according to another embodiment of the present technology. The sectional diagram 500 is also sliced from the A-A line, perpendicular to the plane of FIG. 3

In FIG. 3, three dashed lines 1, 2 and 3 divide the semiconductor die 300 into a MOSFET area 31 inside the line 1, a Schottky diode area 32 inside the line 2 and outside the line 1, and a termination area 33 inside the line 3 and outside the line 2. In some embodiments, the semiconductor die 300 may comprise other circuit(s) and/or other structure(s) between the Schottky diode area 32 and the termination area 33. In other embodiments, the three areas 31, 32 and 33 comprise part of the semiconductor die 300, or in other words, the semiconductor die 300 further comprises other circuit/circuits and/or other structure/structures outside line 3.

Continuing the description of FIG. 3, regions 301 represent doped rings with a different doping type from a substrate of the semiconductor die 300. In some embodiments, the semiconductor die 300 includes an NMOS, thus the substrate of the semiconductor die 300 is of N doping type and the regions of P-type rings 301 are of P doping type. P-type rings 301 are formed at the Schottky diode area 32 and the termination area 33. The P-type rings 301 of the Schottky diode surrounds the MOSFET area 31. Although only two P-type rings 301 are shown in the Schottky diode area 32 and termination area 33 in FIG. 3, the number of P-type rings can be greater than two or other suitable number. In some embodiments, the pattern of the P-type rings 301 is different from the multiple continuous circularity pattern as shown in FIG. 3. For example, in certain embodiments, the P-type rings 301 in Schottky diode area 32 may have an intermittent pattern and/or other suitable patterns.

The regions 302 in FIG. 3 represent metal contacts. The metal contact over the surface of the MOSFET area 31 and the Schottky diode area 32 is the source metal, and the rectangular metal contact outside line 2 at the right bottom side is the gate metal. The source metal is placed over the MOSFET area 31 and the Schottky diode area 32, and functions as the source of the MOSFET and also the anode of the Schottky diode. The P-type rings 301 of the Schottky diode area 32 are under and at the edge of the source metal. Between each of the two P-type rings 301 of the Schottky diode area 32, Schottky contacts are manufactured to form the Schottky diode. The gate metal is connected to the gate of the MOSFET. As shown in FIG. 3, the gate metal is positioned in the termination area 33. In one embodiment, the Schottky diode area 32 and the gate metal are surrounded by the termination structure which comprises the P-type rings 301 of the termination area 33. It is noted that the patterns shown in FIG. 3 for the regions 301 and 302 are overlapped to indicate the overlapping of the two types of regions.

The sectional diagram of the semiconductor die 400 shows only a part of the semiconductor die 300 along the line A-A, not running through the whole diameter of the semiconductor die 300. Thus the left edge of the sectional diagram 400 is depicted in a broken line to illustrate that the sectional diagram 400 only shows part of the semiconductor die 300. The semiconductor die 400 comprises a MOSFET area 41, a Schottky diode area 42 and a termination area 43. The MOSFET fabricated in the MOSFET area 41 and the Schottky diode fabricated in the Schottky diode area 42 shown in FIG. 4 are N-typed vertical devices for illustration purposes though other types of MOSFET and/or Schottky diodes may also be used, e.g., PMOS and P-type Schottky diodes with opposite doping types.

Referring to FIG. 4, the MOSFET area 41, the Schottky diode area 42 and the termination area 43 share an N+ substrate 401, an N− epitaxial layer 402 on top of the N+ substrate 401, and a dielectric layer 403 on top of the N+ epitaxial layer 402. The N+ substrate 401 functions as the drain D for the MOSFET and the cathode of the Schottky diode. In some embodiments, the N− layer 402 is the substrate and the N+ layer 401 is an epitaxial layer. Yet in other embodiments, both the N+ and N− layers 401 and 402 comprise the substrate. In the N− layer 402, P doped regions 412, 422 and 432 are formed sharing the same mask. The P doped regions 412 in MOSFET area 41 function as the body of the MOSFET. The P-type rings 422 in Schottky diode area 42 are adopted to improve the breakdown voltage as described in more detail below. The P-type rings 422 at the termination area 43 function as a termination structure. The dielectric layer 403 is used for electrical isolation in some embodiments.

In the illustrated embodiment, trench gate MOSFET is fabricated in the MOSFET area 41. The MOSFET comprises the N+ substrate 401 functioning as the drain electrode D, the P region 412 functioning as the body, the P+ body contact region 413, the N+ source region 414, the source contact 411, the trench gate region 415 functioning as the gate electrode G and the dielectric layer 416 aligning with the trench gate region 415. The source contact 413 contacts the source metal 40 which functions as the source electrode S of the MOSFET. The trench gate region 415 is filled with polysilicon in some embodiments. In other embodiments, other types of MOSFET may also be fabricated in the MOSFET area 41.

In the Schottky diode area 42, a Schottky diode is fabricated between the P-type rings 422. The Schottky diode comprises the cathode sharing the N+ substrate 401, the anode comprising the Schottky contacts 421, the N− epitaxial layer 402 and the source metal 40 contacting the Schottky contact 421. The source metal 40 is placed over the Schottky diode area 42 to electrically couple and short the source region 414, the Schottky contact 421 and the P-type rings 422. The word "couple" here refers to direct connection or indirect connection through an electrical conductor such as a metal.

With the configuration described above, during an ON state of the MOSFET, current flows through the channel formed near the trench gate region 415. During an OFF state of MOSFET, when MOSFET is forward biased, the current flows mainly through the Schottky diode due to its low conduction resistance. Current flows sequentially through the source metal 40 (anode of Schottky diode), the Schottky contact 421, the N− epitaxial layer 402, and finally to the N+ substrate 401 as the cathode of Schottky diode.

When the state of MOSFET shifts from forward biasing to reverse biasing, because only electrons participate in such a movement, the reverse recovery time is very short. In one embodiment, the semiconductor die 400 is adopted as a rectifier which has the benefits of the MOSFET and also has low conduction loss during dead time and quick recovery time with the benefit of the integrated Schottky diode. Furthermore, by electrically shorting the P-type rings 422 at the Schottky diode area 42 and the Schottky contacts 421, when the reverse biasing voltage VDS of MOSFET is high enough, the P-type rings 422 pinch off the Schottky diode regions and prevent the Schottky diode from breaking down.

FIG. 5 illustrates an embodiment with a similar configuration as that of FIG. 4 except that the MOSFET is a conventional MOSFET with its gate G fabricated by forming films above the substrate surface. The gate G comprises a gate region 515 and a dielectric layer 516 formed above the surface of the N– epitaxial layer 502. In one embodiment, the material for the gate region 515 is polysilicon. In other embodiments, metals, metal alloys, and/or other suitable conductive materials may be used.

In some embodiments, the P-type rings 422, the P+ contact regions 423 and the contact 424 in the Schottky diode area 42 may be fabricated with the same masks as those used for the P body region 412, the P+ body contact regions 413 and the source regions 411 at the MOSFET area 41, respectively. In other embodiments, the Schottky contacts 421 may be fabricated with the same mask as those used for the source contact 411 of MOSFET. Thus, the manufacturing of the Schottky diode may not require additional masks when being integrated with the MOSFET.

The embodiments shown in FIGS. 3-5 include several P-type rings placed at the periphery of and under the source metal, and the Schottky diode is manufactured between those P-type rings and surrounds the active region of the MOSFET. Thus, the die size utilization rate is high which leads to small die size. Further, the forward current through the Schottky diode is distributed across a wide area, resulting in better thermal characteristics. And also, multiple P-type rings are easily integrated and positioned which may reduce the risk of or even prevent the semiconductor die from breaking down at high voltages.

Figure 6:
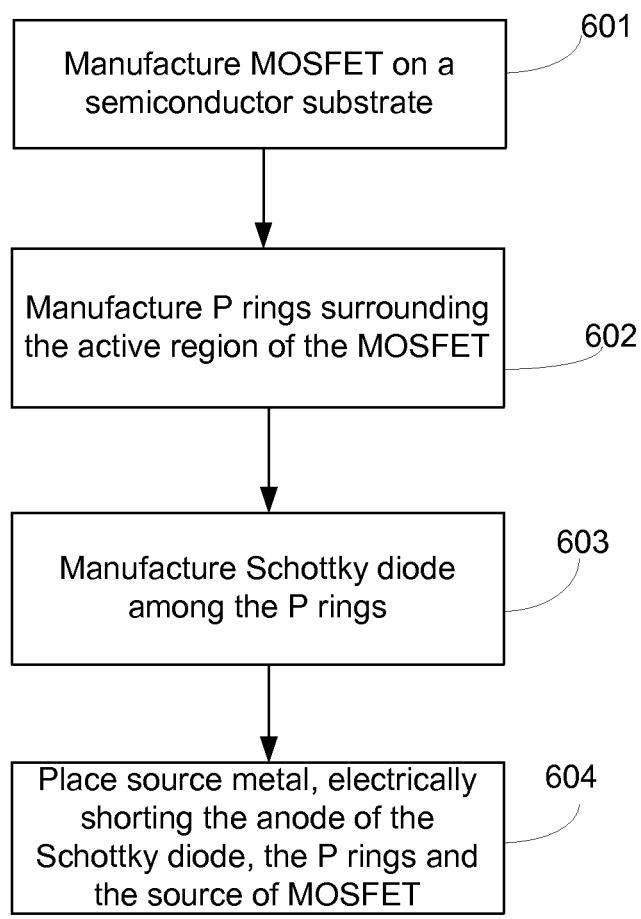
FIG. 6 shows a flow chart illustrating a method of integrating a MOSFET and a Schottky diode according to embodiments of the present technology.

FIG. 6 shows a flow chart illustrating a method of integrating a MOSFET and a Schottky diode in a single semiconductor die according to one embodiment of the present technology. The method comprises at stage 601 manufacturing a MOSFET on a single semiconductor substrate. In some embodiments, the MOSFET is an N-type vertical MOSFET (NMOS). In other embodiments, the MOSFET can include P-type and/or other suitable types of MOSFET. At stage 602, the method includes manufacturing at least one P-type rings surrounding the active region of NMOS. The P doped rings are between the MOSFET area and the termination area. At stage 603, the method includes manufacturing a Schottky diode between the P-type rings. In certain embodiments, the MOSFET and the Schottky diode can be manufactured at the same time. And in other embodiments, the MOSFET and the Schottky diode can be manufactured sequentially. At stage 604, the method further includes placing a source metal atop the MOSFET area and the Schottky diode area to electrically short the source of the MOSFET, the anode of Schottky diode, and the P-type rings.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. For example, the MOSFET, the termination structure, and/or the layout of the Schottky diode are not confined to the particular configurations described above, and other suitable configurations may also be used. Accordingly, the disclosure is not limited except as by the appended claims.

We claim:

1. A semiconductor die having a MOSFET and a Schottky diode, the semiconductor die comprising:
   a substrate;
   a MOSFET area in the substrate, the MOSFET area containing an active region of the MOSFET;
   a Schottky diode area in the substrate, the Schottky diode area containing an active region of the Schottky diode;
   a termination area in the substrate, the termination area comprising a plurality of termination structures wherein the Schottky diode area is laterally between the MOSFET area and the termination area;
   a plurality of doped rings having a different doping type from the substrate, wherein the plurality of doped rings are integrated into the substrate and are located laterally within the Schottky diode area, and wherein the doped rings surround the MOSFET area; and
   a gate metal, wherein the gate metal is placed outside of the plurality of doped rings, and wherein the plurality of doped rings and the gate metal are completely surrounded by the plurality of termination structures.

2. The semiconductor die of claim 1, wherein:
   the Schottky diode has an anode and a cathode;
   the MOSFET has a source and a drain;
   the anode of the Schottky diode is coupled to the source of the MOSFET; and
   the cathode of the Schottky diode is coupled to the drain of the MOSFET.

3. The semiconductor die of claim 1, wherein the Schottky diode area substantially surrounds the MOSFET area.

4. The semiconductor die of claim 1 further comprising:
   a source metal placed over the MOSFET area and the Schottky diode area.

5. The semiconductor die of claim 4, wherein the doped rings are at a periphery of the source metal.

6. The semiconductor die of claim 4, wherein the source metal electrically couples to a source of the MOSFET, to the anode of the Schottky diode, and to the plurality of doped rings.

7. The semiconductor die of claim 4, wherein the plurality of doped rings are located beneath the source metal.

8. The semiconductor die of claim 1, wherein the MOSFET is a trench gate MOSFET.

9. A semiconductor device having a bottom side and an opposing top side, the semiconductor device comprising:
   a substrate proximate the bottom side of the semiconductor device, wherein the substrate is doped with a first doping type;
   an epitaxial layer above the substrate, wherein the epitaxial layer is doped with the first doping type;
   a MOSFET having a body region, a source region, a drain region, and a gate, wherein the body region and the source region are located in the epitaxial layer;
   a plurality of doped rings with a second doping type, wherein the plurality of doped rings are in the epitaxial layer, and wherein the doped rings surround the MOSFET;
   a plurality of Schottky contacts between the adjacent doped rings;
   a source metal over the MOSFET and the Schottky contacts; and
   a gate metal, wherein the gate metal is placed outside of the plurality of doped rings, and wherein the plurality of doped rings and the gate metal are completely surrounded by a plurality of termination structures.

10. The semiconductor device of claim 9, wherein the source metal electrically couples to and shorts the source region, the Schottky contacts, and the plurality of doped rings.

11. The semiconductor device of claim 9, wherein the first doping type is N-type and the second doping type is P-type.

* * * * *